United States Patent [19]
Cho

[11] Patent Number: 6,041,093
[45] Date of Patent: Mar. 21, 2000

[54] VARIABLE FREQUENCY DIVIDING CIRCUIT

[75] Inventor: Sung Ky Cho, Kyungki-do, Rep. of Korea

[73] Assignee: LG Semicon Co., Ltd., Chungcheongbuk-Do, Rep. of Korea

[21] Appl. No.: 09/138,071

[22] Filed: Aug. 21, 1998

[30] Foreign Application Priority Data

Aug. 22, 1997 [KR] Rep. of Korea ...................... 97-40189

[51] Int. Cl.[7] .................................................. H03K 21/00
[52] U.S. Cl. .......................... 377/47; 327/115; 327/117; 327/299
[58] Field of Search .............. 377/47; 327/115, 327/117, 299

[56] References Cited

U.S. PATENT DOCUMENTS

| | | | |
|---|---|---|---|
| 4,383,303 | 5/1983 | Hoffman | 377/47 |
| 4,393,301 | 7/1983 | Svendsen | 377/47 |
| 5,091,699 | 2/1992 | Erickson et al. | 377/47 |
| 5,384,816 | 1/1995 | Prysby et al. | 377/48 |
| 5,389,826 | 2/1995 | Sonobe | 307/125 |
| 5,469,485 | 11/1995 | Ferrant | 377/107 |

*Primary Examiner*—Margaret R. Wambach
*Attorney, Agent, or Firm*—Morgan, Lewis & Bockius LLP

[57] ABSTRACT

A variable frequency dividing circuit adjusts the frequency dividing ratio by a non integer. The variable frequency dividing circuit includes a sequence storing part for storing an N-bit sequence data to output the N bits of the sequence data in parallel. The variable frequency dividing circuit also includes a sequence generator for receiving the N-bit sequence data from the sequence storing pan to generate a sequence control signal and a sequence control signal converter for converting the sequence control signal according to a frequency variation request to generate the converted sequence control signal. The variable frequency dividing circuit further includes a frequency divider for dividing a clock signal frequency according to the converted sequence control signal outputted from the sequence control signal converter and a clock signal generator for producing a clock waveform in accordance with the divided clock signal frequency.

22 Claims, 14 Drawing Sheets

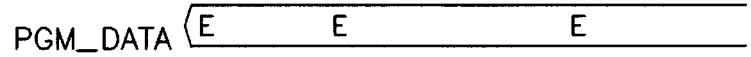
FIG.14A  PGM_DATA
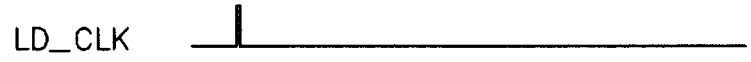
FIG.14B  LD_CLK
FIG.14C  RESET
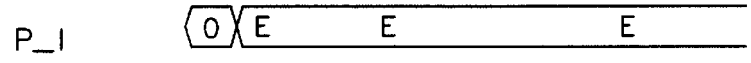
FIG.14D  P_I
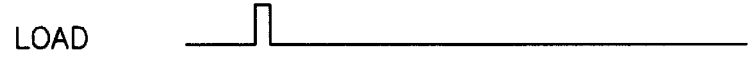
FIG.14E  LOAD
FIG.14F  S_O
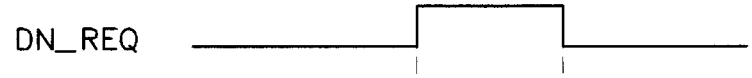
FIG.14G  DN_REQ
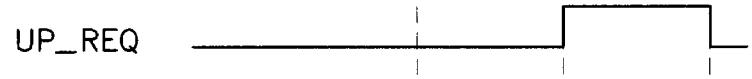
FIG.14H  UP_REQ
FIG.14I  CTL
FIG.14J  CNT 0
FIG.14K  CNT 1
FIG.14L  CLK_IN
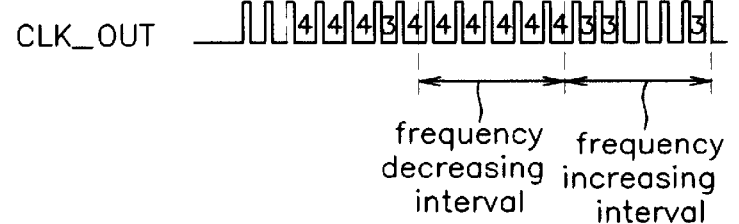
FIG.14M  CLK_OUT
frequency decreasing interval
frequency increasing interval 6,041,093

1

VARIABLE FREQUENCY DIVIDING CIRCUIT

This application claims the benefit of Korean Application No. 40189/1997 filed Aug. 22, 1997, which is hereby incorporated by reference.

BACKGROUND OF THE INVENTION

1. Field of the Invention

The present invention relates to a frequency dividing circuit, and more particularly, to a variable frequency dividing circuit which is capable of dividing a frequency by a non-integer and adjusting a frequency division ratio as desired.

2. Discussion of Related Art

Generally, a frequency dividing circuit, which counts an oscillation clock and outputs the frequency-divided clock, is widely used in a frequency generator for appropriately dividing a basic oscillation frequency to generate a desired frequency. However, a conventional frequency dividing circuit has various problems. First, construction of the conventional circuit is complicated. Second, in response to an input frequency increasing and decreasing control signals are generated after a long delay. Third, a delay time period is increased before generation of frequency variation. Finally, the conventional circuit is easily influenced by noise.

FIG. 1 is a block diagram illustrating a conventional variable frequency dividing circuit. FIG. 2 is a circuit diagram illustrating a variable controller 20 of FIG. 1, and FIG. 3 is a circuit diagram illustrating a frequency divider 40 of FIG. 1.

As shown in FIG. 1, the conventional variable frequency dividing circuit includes a variable controller 20, which receives as inputs a frequency increasing signal INCMT, a frequency decreasing signal DECMT, a clock pulse CP, and a reset sinal RST to output an increasing control signal IN__INC and a decreasing control signal IN__DEC. The conventional circuit also includes a frequency divider 40, which receives the increasing control signal IN__INC and the decreasing control signal IN__DEC from the variable controller 20, and performs a frequency division.

Under the above construction, if a frequency higher or lower than a current frequency is desired, the conventional variable frequency dividing circuit drives the variable controller 20 to obtain a higher or lower frequency as desired.

As shown in FIG. 2, the variable controller 20 includes a decreasing controller 21, which outputs the decreasing control signal IN__DEC in accordance with the frequency decreasing signal DECMT. The variable controller 20 also includes an increasing controller 31, which outputs the increasing control signal IN__INC in accordance with the frequency increasing signal INCMT. Typically, the decreasing controller 21 includes a first flip-flop 22, which receives the frequency decreasing signal DECMT at its input terminal D and outputs a signal from its positive output terminal Q or negative output terminal $\overline{Q}$ according to the clock pulse CP. The decreasing controller 21 also includes a second flip-flop 23, which receives the positive output signal Q of the first flip-flop 22 at its input terminal D and outputs a signal from its positive output terminal Q according to the clock pulse CP. The decreasing controller 21 includes a first AND gate 25, which receives inputs from the negative output terminal $\overline{Q}$ of the first flip-flop 22 and the positive output terminal Q of the second flip-flop 23 to output the result of an AND operation to node N1. The decreasing

2 controller 21 includes a second AND gate 24, which logically ANDs the signal at node N2 and a signal IN1. The decreasing controller 21 further includes a third flip-flop 26, which receives the output of the second AND gate 24 at its input terminal D, the output of the first AND gate 25 at its terminal TE, and the reset signal RST at its terminal T1 to output the signal to the node N2 through its positive output terminal Q according to the clock pulse CP. Finally, the decreasing controller 21 includes a fourth flip-flop 27, which receives the positive output signal Q of the third flip-flop 26 at its input terminal D, feeds the signal at its own positive output terminal Q back to its terminal T1, and receives signal IN1 at its terminal TE to output a signal at the positive output terminal Q to a node N3 and output the signal at the negative output terminal $\overline{Q}$ as the decreasing control signal IN__DEC according to the clock pulse CP.

Also as shown in FIG. 2, the increasing controller 31 includes a fifth flip-flop 32, which receives the frequency increasing signal INCMT at its input terminal D and outputs a signal from its positive output terminal Q or negative output terminal $\overline{Q}$ according to the clock pulse CP. The increasing controller 31 also includes a sixth flip-flop 33, which receives the positive output Q of the fifth flip-flop 32 at its input terminal D and outputs a signal from its positive output terminal Q according to the clock pulse CP. The increasing controller 31 includes a third AND gate 35, which logically ANDs the negative output $\overline{Q}$ of the fifth flip-flop 32 and the positive output Q of the sixth flip-flop 33 to output the result of the AND operation to node N4. The increasing controller 31 includes a fourth AND gate 34, which logically ANDs the signal IN1 and the signal at node N5. A seventh flip-flop 36 receives the output of the fourth AND gate 34 at its input terminal D, the output of the third AND gate 35 at its terminal TE, and the reset signal RST at its terminal T1, and outputs its positive output Q to the node N5 according to the clock pulse CP. An eighth flip-flop 37 receives the positive output Q of the seventh flip-flop 36 at its input terminal D, its own positive output Q at its input terminal T1, and the signal IN1 at its terminal TE, and outputs its positive output signal Q to a node N6 according to the clock pulse CP. A ninth flip-flop 38 receives the positive output Q of the seventh flip-flop 37 at its input terminal D, feeds the signal at its positive output terminal Q back to its terminal T1, and receives the signal IN1 at its terminal TE to output its positive output Q to a node N7 according to the clock pulse CP. An OR gate 39 logically ORs the signal at the node N7 and the signal at the node N6, and outputs the ORed result as the increasing control signal IN__INC.

As shown in FIG. 2, the clock pulse CP is inputted to the clock terminal CLK, of each of the first to ninth flip-flops 22, 23, 26, 27, 32, 33, 36, 37, 38. The reset signal RST is inputted to the clear terminal CLR of each of the nine flip-flops. If the reset signal RST is at a logical "low" level, all of the nine flip-flops are cleared. In contrast, if the reset signal RST is at a logical "high" level, all of the nine flip-flops operate according to the clock pulse CP.

As shown in FIG. 3, the frequency divider 40 includes a counting circuit 41, which divides the frequency of the clock pulse CP by four or by three. The frequency divider 40 also includes a counter controller 46, which controls the number of frequency divisions by four and the number of frequency divisions by three of the counting circuit 41 according to the output of the variable controller 20 to adjust a divided frequency.

The counting circuit 41 includes a first counter 42, which receives the reset signal RST at its terminals CD and T, a signal at node N12 at its terminal A, and the ground voltage at its terminal B. The first counter 42 generates an output CO to node N10. A first inverter 43 receives the output CO and feeds the inverted output to terminal L of the first counter 42. The first counter 42 outputs signals to nodes N8 and N9 through its output terminals QA and QB. The counting circuit 41 further includes a fifth AND gate 45, which logically ANDs the outputs QA and QB of the first counter 42, and outputs the ANDed result as a frequency-divided clock OUT-CLK.

The counter controller 46 includes a second counter 47, which receives the ground voltage at its terminal A, the clock pulse CP at its terminal CP, the output CO of the first counter 42 at its terminal T, and the reset signal RST at its terminal CD to generate an output signal at its terminal CO. The counter controller 46 also includes a sixth AND gate 49, which logically ANDs the output of the second counter 47 and the decreasing control signal IN_DEC and outputs the ANDed result to the node N12. The output of the sixth AND gate 49 is a counter control signal. Further, the output from the terminal CO of the second counter 47 is inverted by a second inverter 48. The inverted output is then inputted to the variable controller 20 as the signal IN1 and to terminal L of the second counter 47.

In operation, the frequency decreasing signal DECMT and the frequency increasing signal INCMT of the variable controller 20 use a falling edge (from "1" to "0"). Generally, during normal operation, signals DECMT and INCMT have the binary value "1". When frequency variation is needed, they have the value "0". Under the above condition, each of nodes of the variable controller 20 has the following data values given by Table 1.

As shown in FIGS. 4A to 4I, at the normal state since the inputs A and B of the first counter 42 become data "00" and the input L, T and CD become data "1", the first counter 42 operates with the data values "00", "01", "10"and "11". While the first counter 42 is operating with the data value "11", whenever the output value at the total CO thereof is the data "1", the first counter 42 performs a frequency division by four by executing the counting operation at the data values "00", "01", "10" and "11". When the output value at the terminal CO of the second counter 47 is data "1", and AND gate 49 outputs the data "1" to the input A of the first counter 42. At the time, the first counter 42 performs a frequency division by three by executing the counting operation at the data values "01", "10" and "11". Thus, the output clock OUT_CLK repeats the cycle in the order of a frequency division by four, a frequency division by four, a frequency division by four, and a frequency division by three (4-4-4-3).

FIGS. 5A to 5I are waveform diagrams illustrating the operation in a frequency decreasing state of FIG. 1.

FIG. 5A is a waveform of the clock pulse CP. FIG. 5B is a waveform of the reset signal RST. FIG. 5C is a waveform of the frequency decreasing signal DECMT. FIG. 5D is a waveform of the frequency increasing signal INCMT. FIG. 5E is a waveform of the signal on the node N1. FIG. 5F is a waveform of the signal on the node N4. FIG. 5G is a waveform of the signal on the node N8. FIG. 5H is a waveform of the signal on the node N9. FIG. 5I is a waveform of the frequency-divided output clock OUT_CLK.

As shown in FIGS. 5A to 5I, if the frequency decreasing signal DECMT inputted to the variable controller 20

TABLE 1

| Division | DECMT | INCMT | N1 | N2 | N3 | N4 | N5 | N6 | N7 | IN_INC | IN_DEC |
|---|---|---|---|---|---|---|---|---|---|---|---|
| Normal Operation | 1 | 1 | 0 | 0 | 0 | 0 | 0 | 0 | 0 | 0 | 1 |
| Frequency Decrement | 1→0 | 1 | 1 | 1 | 1 | 0 | 0 | 0 | 0 | 0 | 0 |
| Frequency Increment | 1 | 1→0 | 0 | 0 | 0 | 1 | 1 | 1 | 1 | 1 | 1 |

As shown in Table 1, the increasing control signal IN_INC has the data "1" as an active value, and the decreasing control signal IN_DEC has the data "0" as an active value.

In the frequency divider 40, the first counter 42 operates as a 2-bit clock and executes a counting operation up to data "11" from initial values A and B. Thus, the counter outputs the value of the terminal CO as the data "1". When a load signal L has the value of data "0", the first counter 42 loads the initial value, and when an operation signal T has the value of data "1", the counter executes the counting operation.

FIGS. 4A to 4I are waveform diagrams illustrating the operation at a normal state of FIG. 1.

FIG. 4A is a waveform of the clock pulse CP. FIG. 4B is a waveform of the reset signal RST. FIG. 4C is a waveform of the frequency decreasing signal DECMT. FIG. 4D is a waveform of the frequency increasing signal INCMT. FIG. 4E is a waveform of the signal at the node N1. FIG. 4F is a waveform of the signal at the node N4. FIG. 4G is a waveform of the signal at the node N8. FIG. 4H is a waveform of the signal at the node N9. FIG. 4I is a waveform of the frequency-divided output clock OUT_CLK.

changes from a logical "high" to a logical "low" to decrease the frequency, a logical "high" pulse is generated at the node N1 to change the decreasing control signal IN_DEC to the logical "low". As a result, the output clock OUT_CLK repeats the cycle in the order of a frequency division by four, a frequency division by four, a frequency division by four, and a frequency division by four (4-4-4-4). Therefore, since the number of frequency division is increased in comparison with that in the normal state, the frequency of the output clock OUT_CLK is decreased.

FIGS. 6A to 6I are waveform diagrams illustrating the operation in a frequency increasing state of FIG. 1.

FIG. 6A is a waveform of the clock pulse CP. FIG. 6B is a waveform of the reset signal RST. FIG. 6C is a waveform of the frequency decreasing signal DECMT. FIG. 6D is a waveform of the frequency increasing signal INCMT. FIG. 6E is a waveform of the signal on the node N1. FIG. 6F is a waveform of the signal on the node N4. FIG. 6G is a waveform of the signal on the node N8. FIG. 6H is a waveform of the signal on the node N9. FIG. 6I is a waveform of the frequency-divided output clock OUT_CLK.

As shown in FIGS. 6A to 6I, if the frequency increasing signal INCMT inputted to the variable controller 20 changes from a logical "high" to a logical "low" to increase the frequency, a logical "high" pulse is generated at the node N4 to change the increasing control signal IN_INC to the logical "high". Whenever the output value at the terminal CO thereof is the data "1", the second counter 47 executes the counting operation at the data values "10" and "11". Also, whenever the output value at the terminal CO of the second counter 47 is data "1", the AND gate 49 outputs the data "1" to the input A of the first counter 42. At the time, the first counter 42 performs the frequency division by three at data values "01", "10" and "11". Accordingly, the output clock OUT_CLK repeats the cycle in the order of a frequency division by four, a frequency division by three, a frequency division by four, and a frequency division by four (4-3-4-3). Therefore, since the number of frequency division is decreased in comparison with that in the normal state, the frequency of the output clock OUT_CLK is increased.

However, the conventional variable frequency dividing circuit has various problems. First, the construction of the variable controller constituting the variable non-integer times frequency dividing circuit is substantially complicated. Second, frequency increment and decrement according to the increasing and decreasing control signals occur after a long delay. Third, noise can not be avoided due to the use of falling edge of the frequency increasing signal INCMT and the frequency decreasing signal DECMT.

SUMMARY OF THE INVENTION

Accordingly, the present invention is directed to a variable frequency dividing circuit that substantially obviates one or more of the problems due to limitations and disadvantages of the related art.

An object of the invention is to provide a variable frequency dividing circuit which adjusts a frequency dividing ratio according to a ratio variation of a main input clock and an output frequency dividing clock to thereby prevent a malfunction caused due to exterior effects such as a transmission line.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a variable frequency dividing circuit includes a sequence storing part for storing a predefined N-bit sequence data to output the N bits of the sequence data in parallel; a sequence generator for receiving the N-bit sequence data from the sequence storing part to generate a sequence control signal; a sequence control signal converter for receiving the sequence control signal according to a frequency variation request to generate a converted sequence control signal; a frequency divider for dividing a clock signal frequency according to the converted sequence control signal outputted from the sequence control signal converter, and a clock signal generator for producing a clock waveform in accordance with the divided clock signal frequency.

In another aspect of the present invention, a variable frequency dividing circuit includes a sequence generator for generating a sequence control signal; a sequence control signal converter for receiving the sequence control signal according to a frequency variation request to generate a converted sequence control signal; and a frequency divider for dividing a clock signal frequency according to the converted sequence control signal outputted from the sequence control signal converter.

In a further aspect of the present invention, a variable frequency dividing circuit includes a sequence storing part for storing a predefined N-bit sequence data to output the N bits of the sequence data in parallel, wherein the sequence storing part comprises N D flip-flops connected in parallel to a data bus to output the stored sequence data in parallel; a sequence generator for receiving the N-bit sequence data from the sequence storing part to generate a series of sequence control signals, wherein the sequence generator comprises D flip-flops which are connected in series with each other for sequentially outputting a series of sequence control signals; a sequence control signal converter for receiving the sequence control signal according to a frequency variation request to generate a converted sequence control signal, wherein the sequence control signal converter comprises a NOR gate which logically NORs a frequency increasing signal and a frequency decreasing signal, and outputs the NORed result, and a three-input multiplexor which receives an output signal of the NOR gate, the frequency increasing signal and the frequency decreasing signal as selection signals and selects and outputs one of the sequence control signal received from the sequence generator, a binary signal "0", and a binary signal "1"; a frequency divider for dividing a clock signal frequency according to the converted sequence control signal outputted from the sequence control signal converter, wherein the frequency divider comprises an inverter for inverting the converted sequence control signal, a first mode counter which receives the inverted signal from the inverter and generates an output signal to a first input terminal of an output selector, and a second mode counter which receives the converted sequence control signal and generates an output signal to a second input terminal of the output selector, wherein the output selector receives as inputs the output signals of the first and second mode counters and generates an output to the clock signal generator, and a clock signal generator for producing a clock waveform in accordance with the divided clock signal frequency.

It is to be understood that both the foregoing general description and the following detailed description are exemplary and explanatory, and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this specification, illustrate embodiments of the invention and, together with the description, serve to explain the principles of the invention.

In the drawings:

FIGS. 14A to 14M are waveforms illustrating operation of the variable frequency dividing circuit according to the present invention.

DETAILED DESCRIPTION OF PREFERRED EMBODIMENTS

Reference will now be made in detail to the preferred embodiments of the present invention, examples of which are illustrated in the accompanying drawings.

Figure 7:
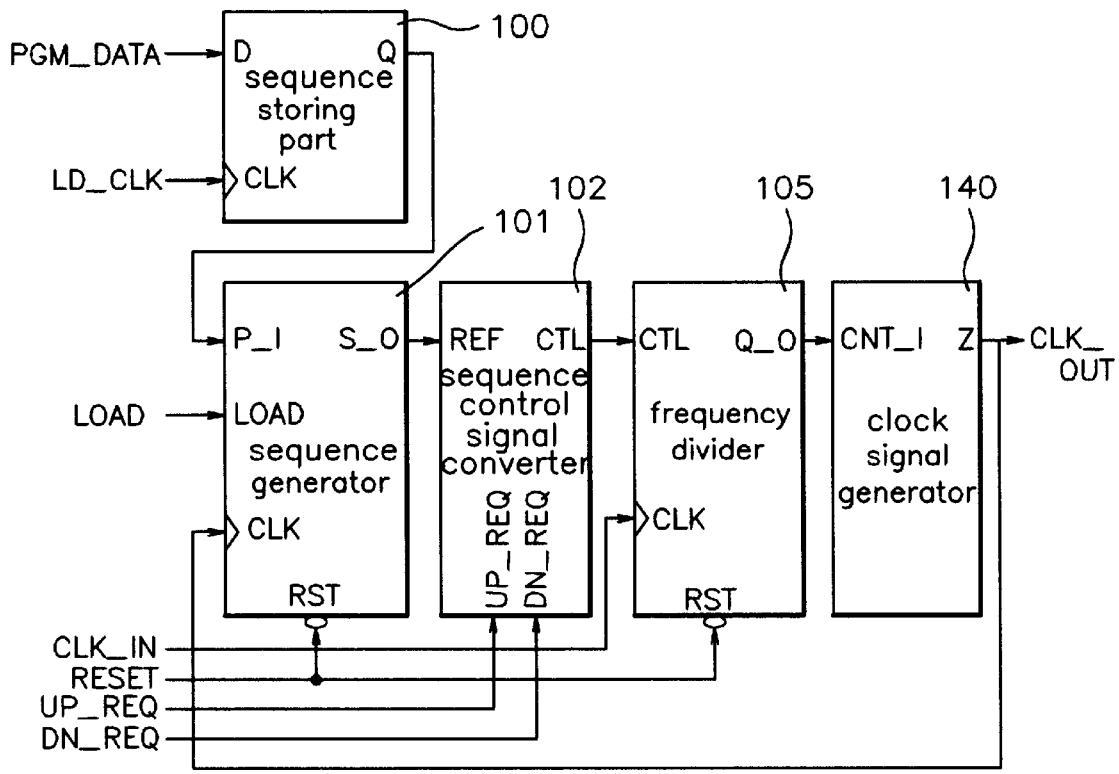
FIG. 7 is a block diagram illustrating a variable frequency dividing circuit according to a first embodiment of the present invention.
Figure 8:
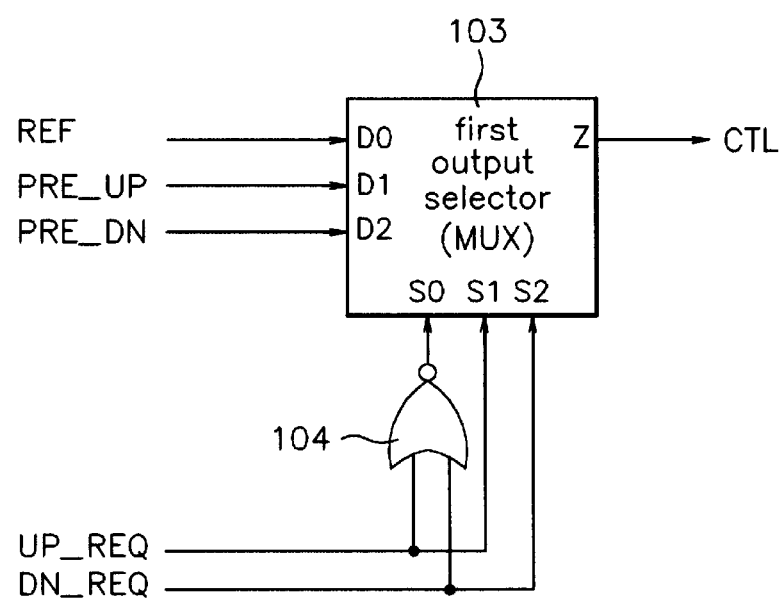
FIG. 8 is a circuit diagram illustrating a sequence control signal converter of FIG. 7.
Figure 9:
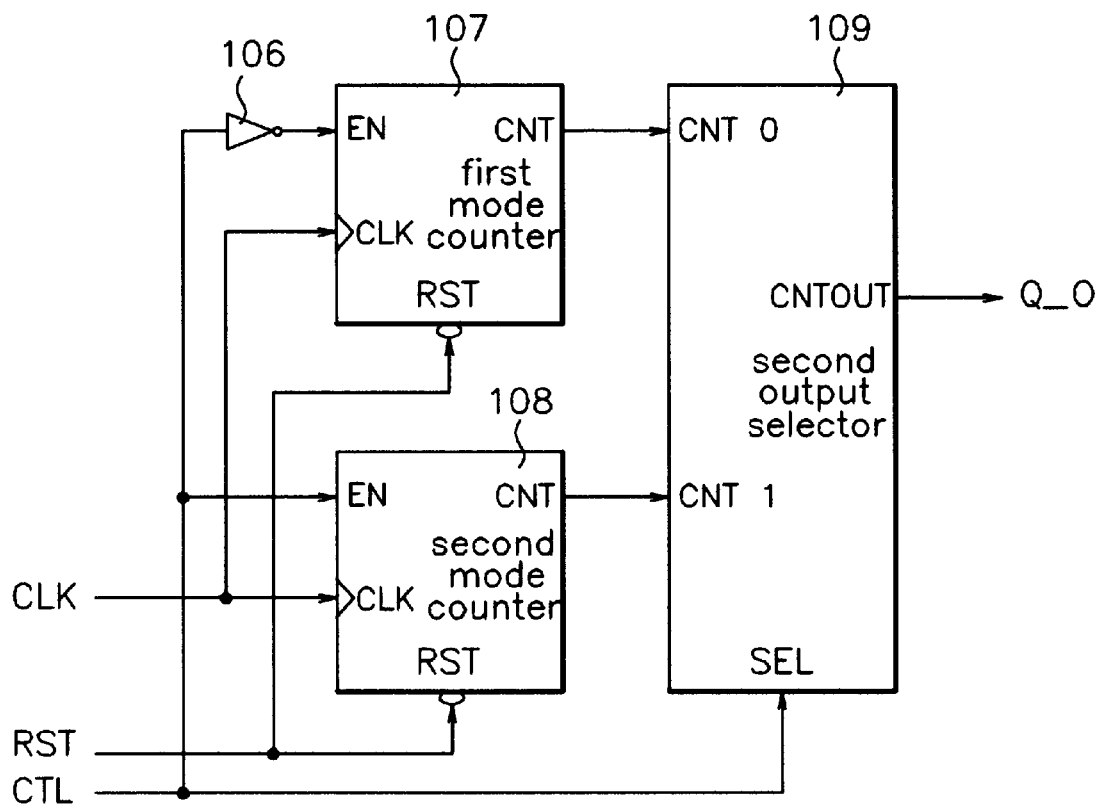
FIG. 9 is a circuit diagram illustrating an embodiment of a frequency divider of FIG. 7.

FIG. 7 is a block diagram illustrating a variable frequency dividing circuit according to a first embodiment of the present invention. FIG. 8 is a circuit diagram illustrating a sequence control signal converter of FIG. 7. FIG. 9 is a circuit diagram illustrating an embodiment of a frequency divider of FIG. 7.

As shown in FIG. 7, a variable frequency dividing circuit according to the present invention includes a sequence storing part 100 which stores an N-bit sequence data predefined by a user. A sequence generator 101 receives the N-bit sequence data from the sequence storing part 100 in parallel to generate a series of sequence control signals. A sequence control signal converter 102 converts the sequence control signal according to a frequency variation request or outputs the sequence control signal without change. A frequency divider 105 receives the sequence control signal outputted from the sequence control signal converter 102 and divides the frequency of the signal. A clock signal generator 140 produces an output clock waveform in accordance with a counted value of the frequency divider 105.

The sequence storing part 100 receives program data PGM_DATA at input terminal D and clock pulse input data LD_CLK at terminal CLK, and generates an output signal at its positive output terminal Q. The sequence generator 101 receives the output signal Q of the sequence storing part 100 at terminal P_I, a signal LOAD for loading an initial sequence, and an output clock signal CLK_OUT of the clock signal generator 140 at terminal CLK, and outputs an output signal S_O. The output signal S_O of the sequence generator 101 is inputted to terminal REF of the sequence control signal converter 102. The sequence control signal converter 102 then selectively outputs a control signal CTL in accordance with an output frequency increasing signal UP_REQ and an output frequency decreasing signal DN_REQ.

The frequency divider 105 receives the output control signal CTL from the sequence control signal converter 102 at its terminal CTL and produces an output signal Q_O. The clock signal generator 140 receives the output signal Q_O of the frequency divider 105 at its input terminal CNT_I and generates the output clock signal CLK_OUT at its output terminal Z. The reset signal RST is input to terminal RST of the sequence generator 101 and terminal RST of the frequency divider 105. The frequency divider 105 receives a signal CLK_IN at its terminal CLK.

The construction of the sequence control signal converter 102 and the frequency divider 105 is discussed below in detail with reference to FIGS. 8 and 9.

As shown in FIG. 8, the sequence control signal converter 102 includes a first output selector 103 as a three-input multiplexor and a first NOR gate 104. The first output selector 103 receives signals REF, PRE_UP, and PRE_DN at its input terminals D0, D1 and D2, respectively. Signals PRE_UP and PRE_DN have fixed values. Selection signal terminals S0, S1 and S2 of the first output selector 103 for selecting the signals REF, PRE_UP and PRE_DN respectively receive an output of the first NOR gate 104, the output frequency increasing signal UP_REQ and the output frequency decreasing signal DN_REQ. The first NOR gate 104 receives as inputs the output frequency increasing signal UP_REQ and the output frequency decreasing signal DN_REQ, and generates its output to terminal S0 of the first output selector 103.

As shown in FIG. 9, the frequency divider 105 includes first and second mode counters 107 and 108, a second output selector 109 for selectively outputting output signals of the first and second mode counters 107 and 108, and a first inverter 106.

The first inverter 106 inverts the sequence control signal CTL from the sequence control signal converter 102. The first mode counter 107 receives the inverted sequence control signal from the first inverter 106 at input terminal EN, the clock signal CLK at input terminal CLK and the reset signal RST at input terminal RST. The first mode counter 107 generates an output signal at its output terminal CNT, which is then inputted to an input terminal CNT0 of the second output selector 109.

The second mode counter 108 receives the sequence control signal CTL at its input terminal EN, the clock signal CLK at the input terminal CLK and the reset signal RST at the input terminal RST. The second mode counter 108 generates an output signal at its output terminal CNT, which is then inputted to an input terminal CNT1 of the second output selector 109. The second output selector 109 receives the sequence control signal CTL at its input terminal SEL to output either a count value of the first mode counter 107 or a count value of the second mode counter 108.

In operation, the sequence storing part 100, which stores an N-bit sequence data predefined by a user, has the number of bits corresponding to that of the sequence generator 101. The sequence storing part 100 stores the signal PGM_DATA when the signal LD_CLK is in an active state. When a specific value is fixed by calculation or experiment, the sequence storing part 100 may include a read only memory ROM that causes the sequence generator 101 to generate a specific sequence of data.

Figure 12:
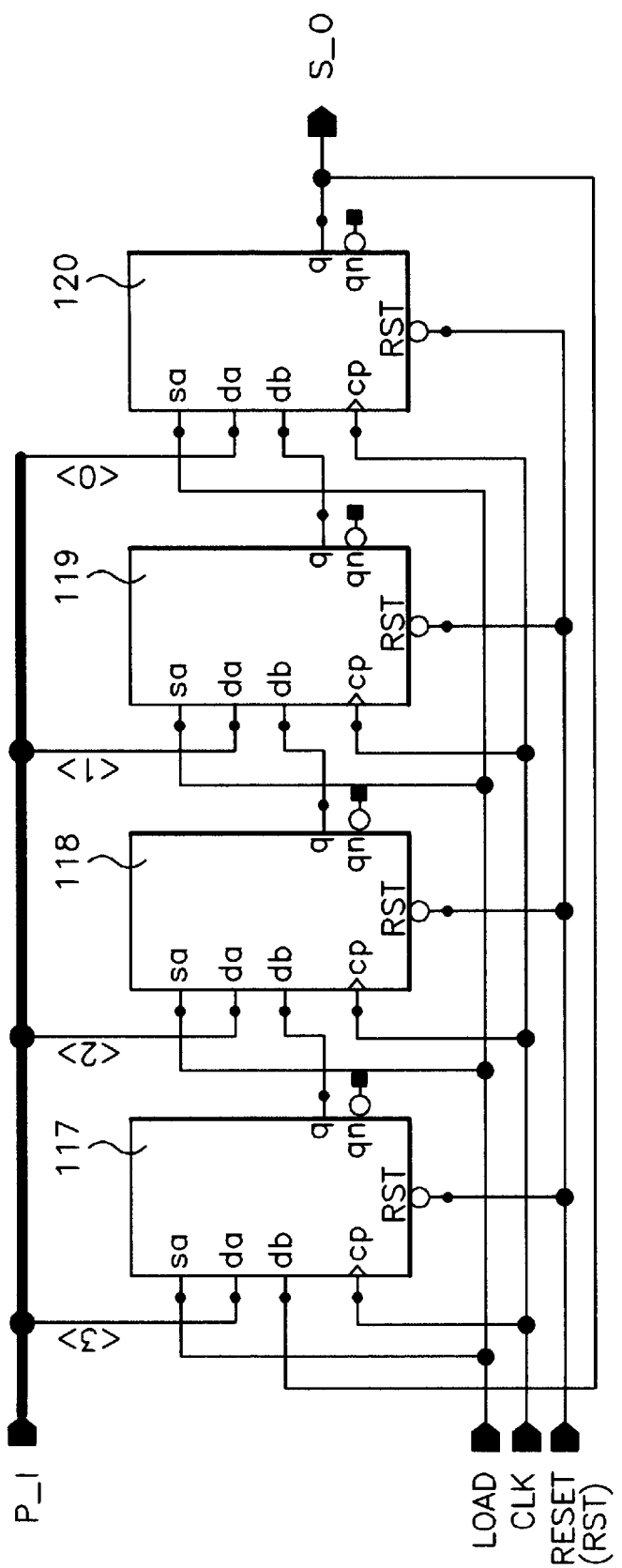
FIG. 12 is a block diagram illustrating a sequence generator of FIG. 10.

The sequence generator 101 is a parallel-to-serial converter, in which N D flip-flops are connected to each other as shown, for example, in FIG. 12. If the signal LOAD is in an active state, it loads the N-bit sequence data in parallel and serially outputs the N bits of data.

The sequence control signal converter 102 produces the control signal CTL to the frequency divider 105 so that the frequency divider 105 selects any one of the first and second mode counters. For example, as shown in FIG. 8, if the signal UP_REQ is active, the sequence control signal converter 102 outputs the signal PRE_UP having a predefined control value. If the signal DN_REQ is active, it outputs the signal PRE_DN having another predefined control value. However, if both of the signals UP_REQ and DN_REQ are active, the sequence control signal converter 102 outputs the output signal CTL without change as a normal sequence.

The frequency divider 105, as shown in FIG. 9, includes the first and second mode counters 107 and 108, each of which has two predefined specific integer values. If the signal CTL has a binary data of "1", the second mode counter 108 operates to output the output CNT as the final output Q_O of the frequency divider 105, and contrarily, if the signal CTL has a binary data of "0", the first mode counter 107 operates to output the output CNT as the final output Q_O of the frequency divider 105.

Figure 15:
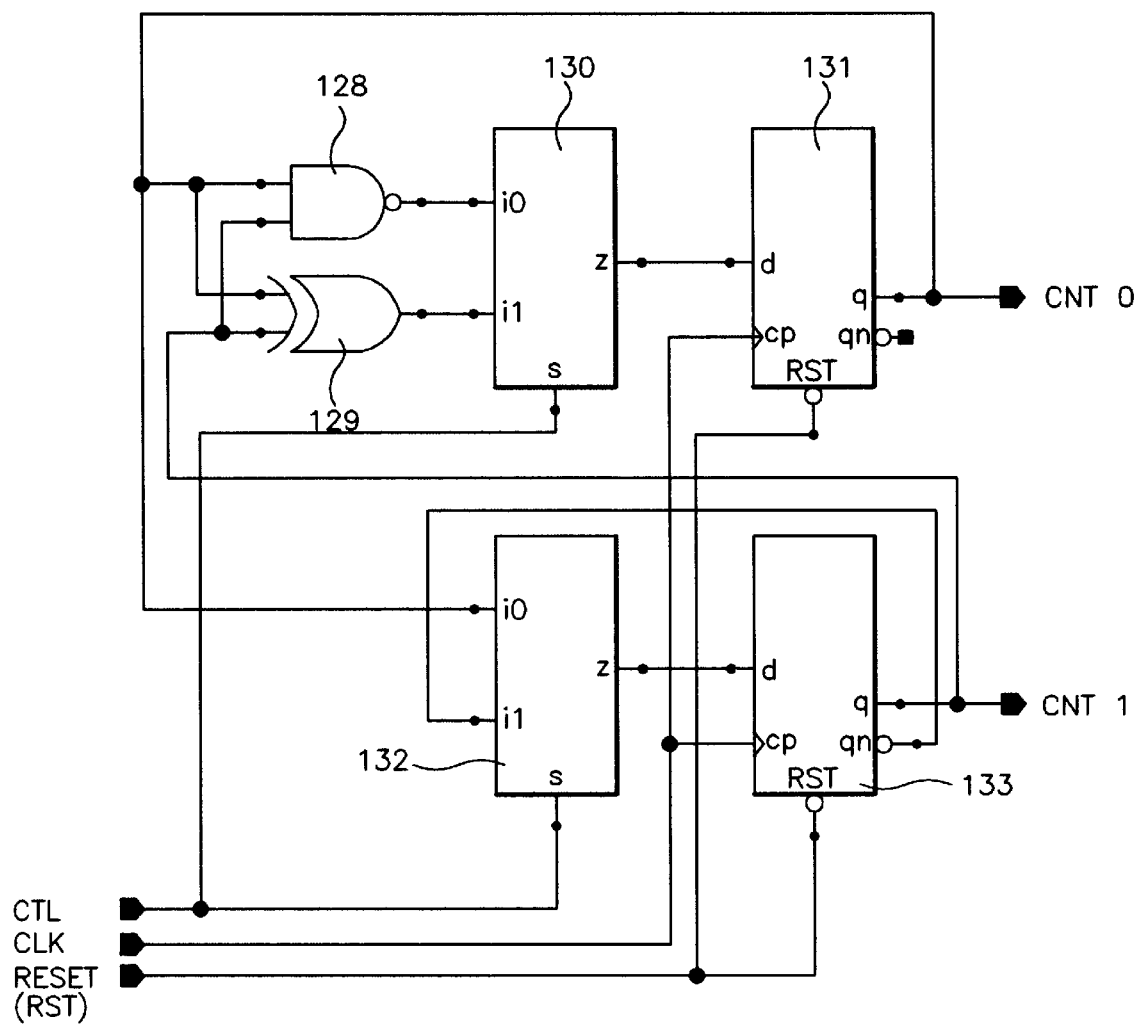
FIG. 15 is a block diagram illustrating another embodiment of a frequency divider of the variable frequency dividing circuit according to the present invention.

As the inputs of the frequency divider 105 having two counters are different, the frequency divider 105 may have a single counter. FIG. 15 is a block diagram illustrating another embodiment of the frequency divider 105 of FIG. 7. As shown in FIG. 15, there is provided a first multiplexor 130 as two-input multiplexor which operates according to the control signals CTL of the sequence control signal converters 102 and 121, and receives output signals of a NAND gate 128 and an exclusive OR gate 129 at input terminals i0 and i1, respectively. A second multiplexor 132 is a two-input multiplexor which operates according to the control signals CTL of the sequence control signal converters 102 and 121, and receives a positive output signal q of a ninth D flip-flop 131 and a negative output signal qn of a tenth D flip-flop 133 at input terminals i0 and i1, respectively. The ninth and tenth D flip-flops 131 and 133 respectively input output signals of the first and second multiplexors 130 and 132 at input terminal d. NAND gate 128 receives as inputs the positive output signals q of the ninth and tenth D flip-flops 131 and 133, and provides the resultant output signal to an input terminal i0 of the first multiplexor 130. The exclusive OR gate 129 receives as inputs the positive output signals q of the ninth and tenth D flip-flops 131 and 133, and provides the resultant output signal to other input terminal i1 of the first multiplexor 130.

Figure 10:
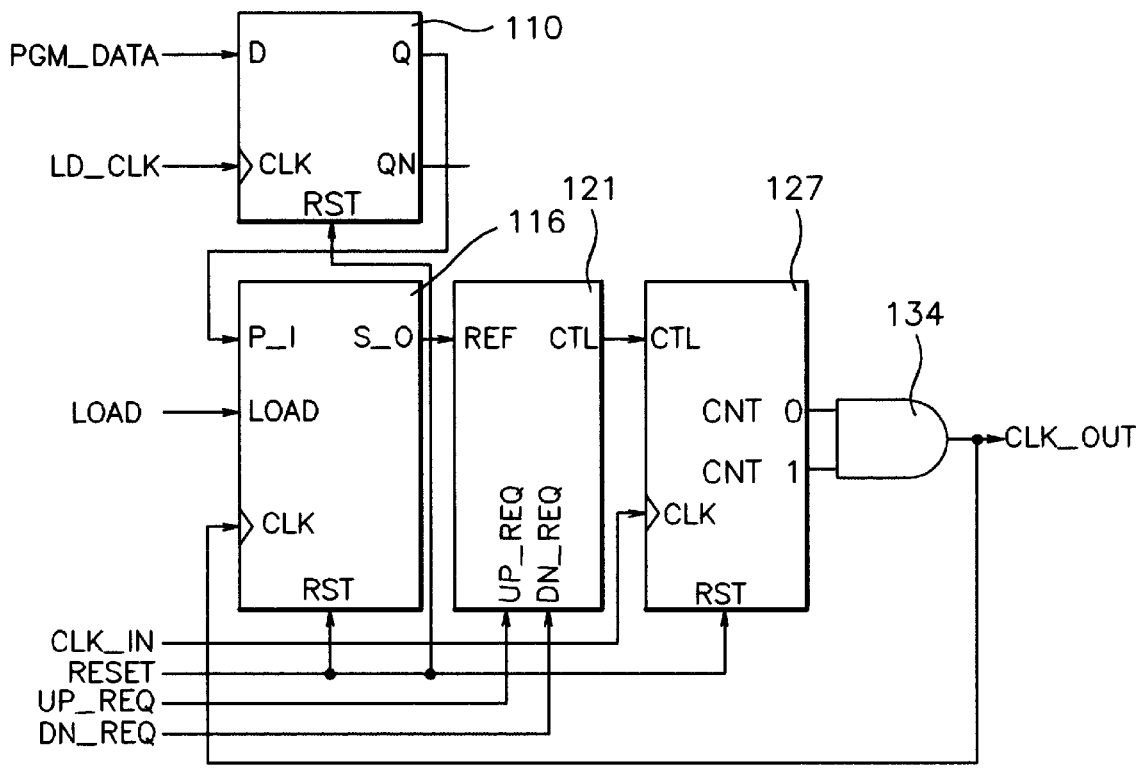
FIG. 10 is a block diagram illustrating a variable frequency dividing circuit according to a second embodiment of the present invention in which a 4-4-4-3 frequency dividing sequence is embodied.
Figure 11:
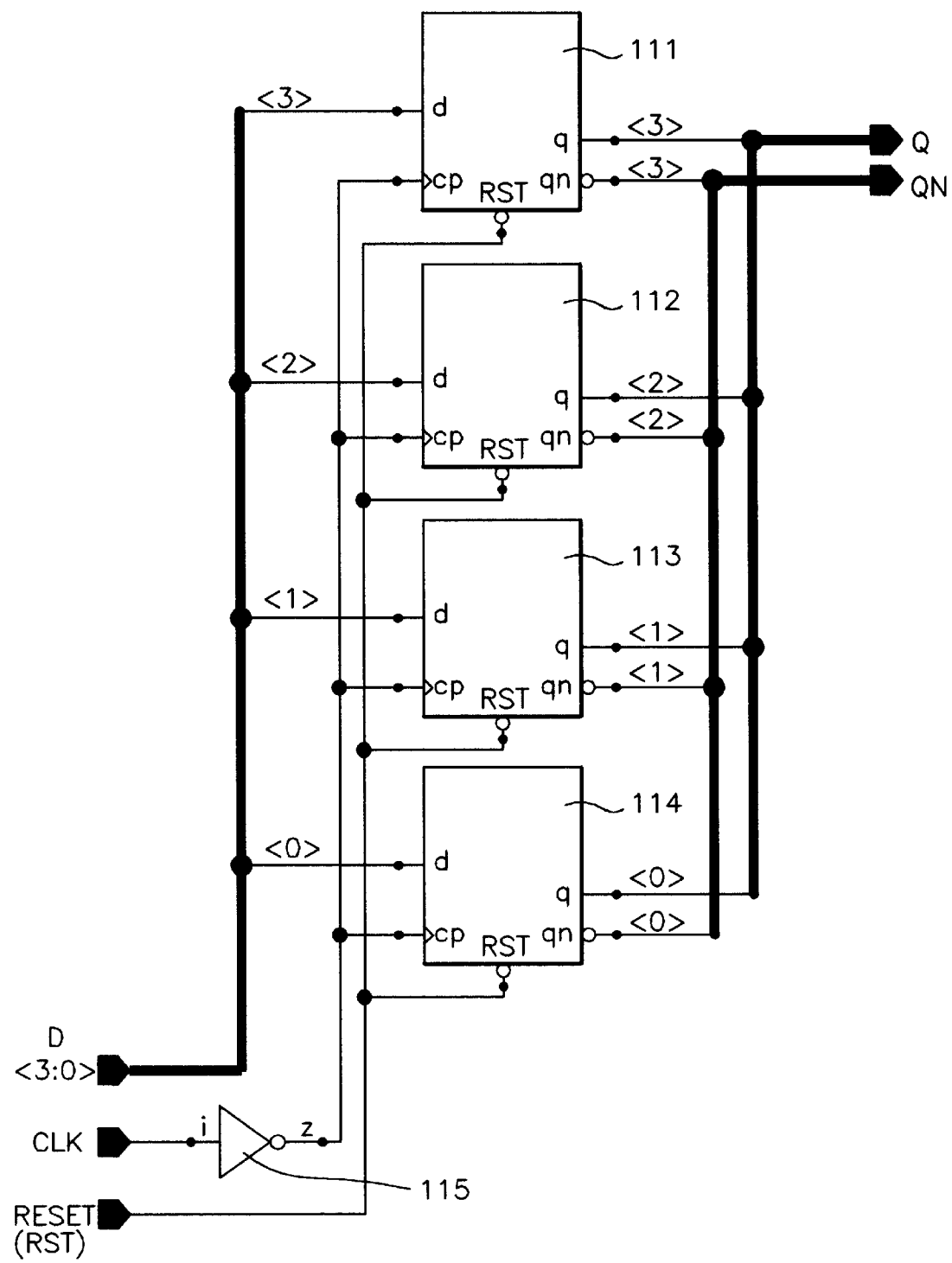
FIG. 11 is a block diagram illustrating a sequence storing part of FIG. 10.
Figure 13:
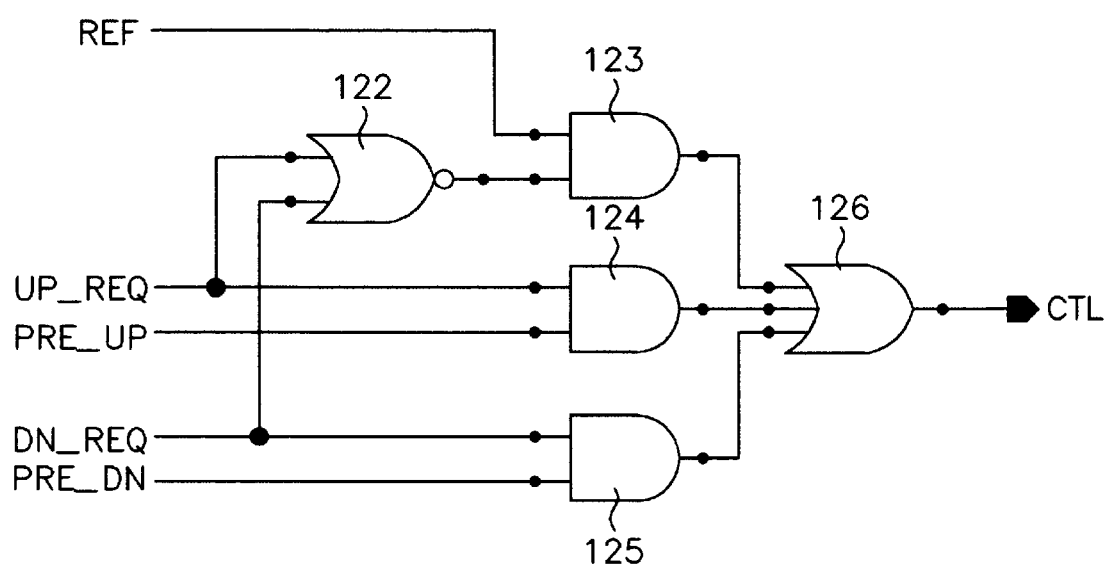
FIG. 13 is a block diagram illustrating a sequence control signal converter of FIG. 10.

FIG. 10 is a block diagram illustrating a variable frequency dividing circuit according to a second embodiment of the present invention in which a 4-4-4-3 frequency dividing sequence is embodied. FIG. 11 is a block diagram illustrating a sequence storing part 110 of FIG. 10. FIG. 12 is a block diagram illustrating a sequence generator 116 of FIG. 10. FIG. 13 is a block diagram illustrating a sequence control signal converter 121 of FIG. 10. FIGS. 14A to 14M are waveforms illustrating operation of the variable frequency dividing circuit according to the present invention.

The construction of the variable frequency dividing circuit as shown in FIG. 10 is the same as that of FIG. 7, except for an AND gate 134 which replaces the clock signal generator 140 of FIG. 7. The AND gate 134 receives as inputs the output signals CNT0 and CNT1 of a frequency divider 127 and generates output clock signal CLK_OUT.

Figure 1:
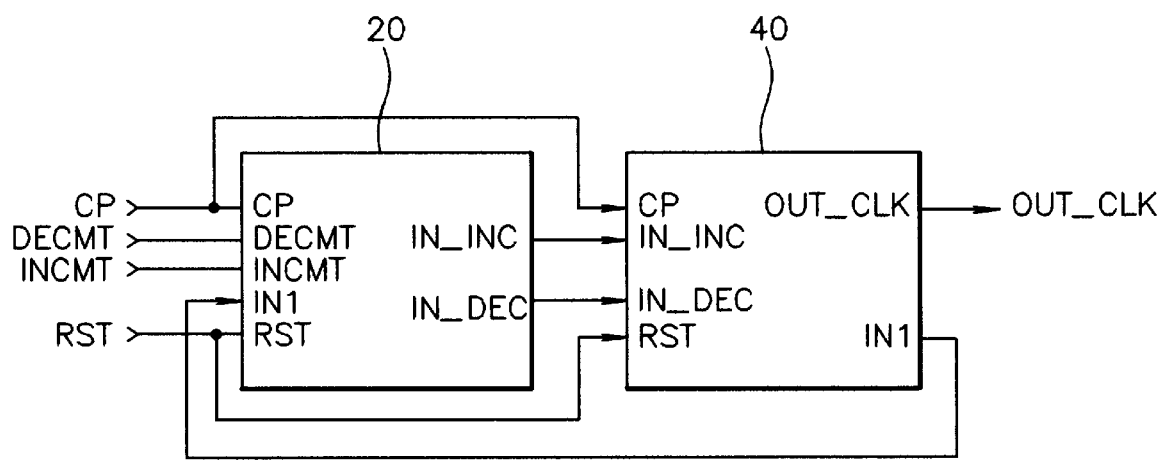
FIG. 1 is a block diagram illustrating a conventional variable frequency dividing circuit.
Figure 2:
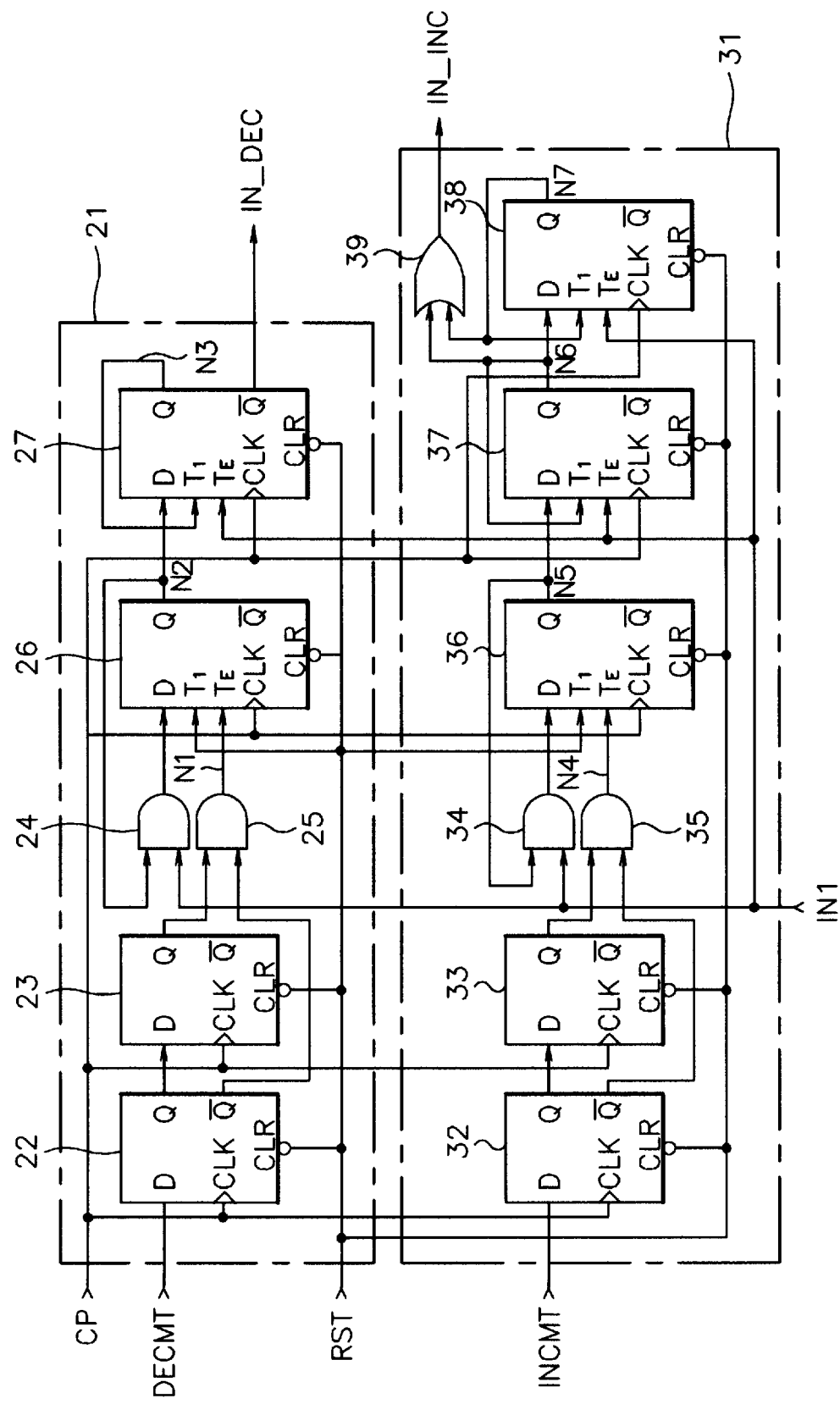
FIG. 2 is a circuit diagram illustrating a variable controller of FIG. 1.
Figure 3:
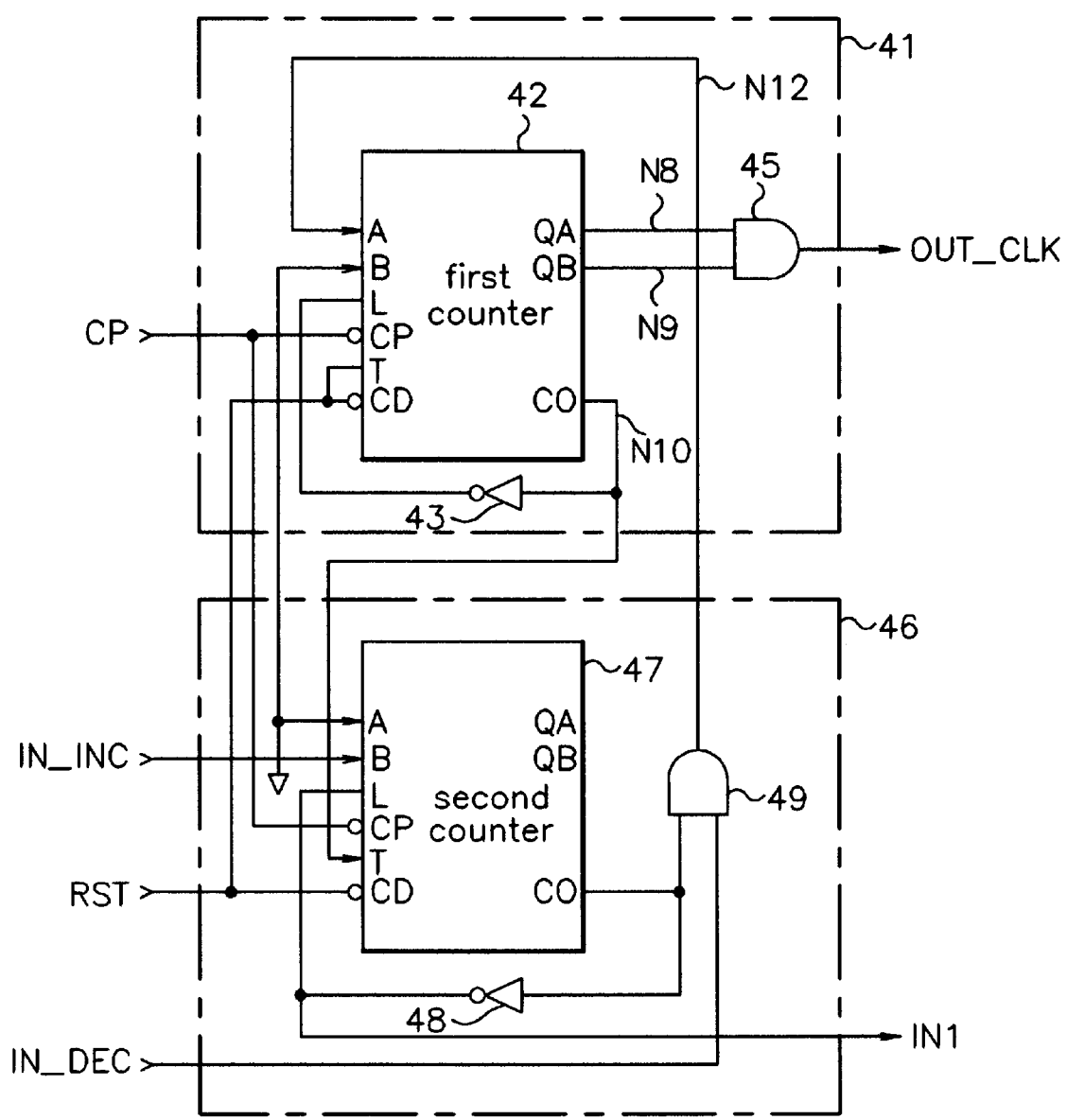
FIG. 3 is a circuit diagram illustrating a frequency divider of FIG. 1.
Figure 4:
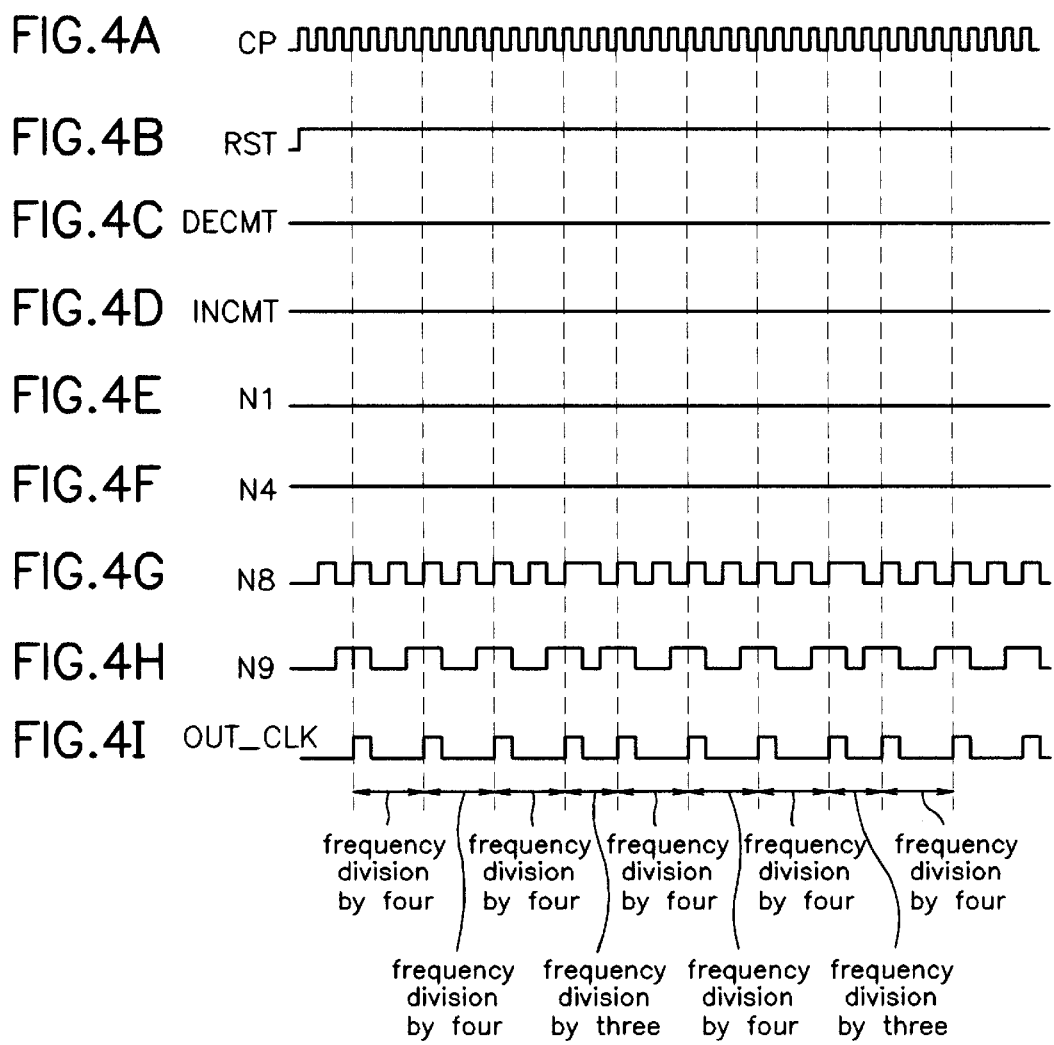
FIGS. 4A to 4I are waveform diagrams illustrating the operation in a normal state of FIG. 1.
Figure 5:
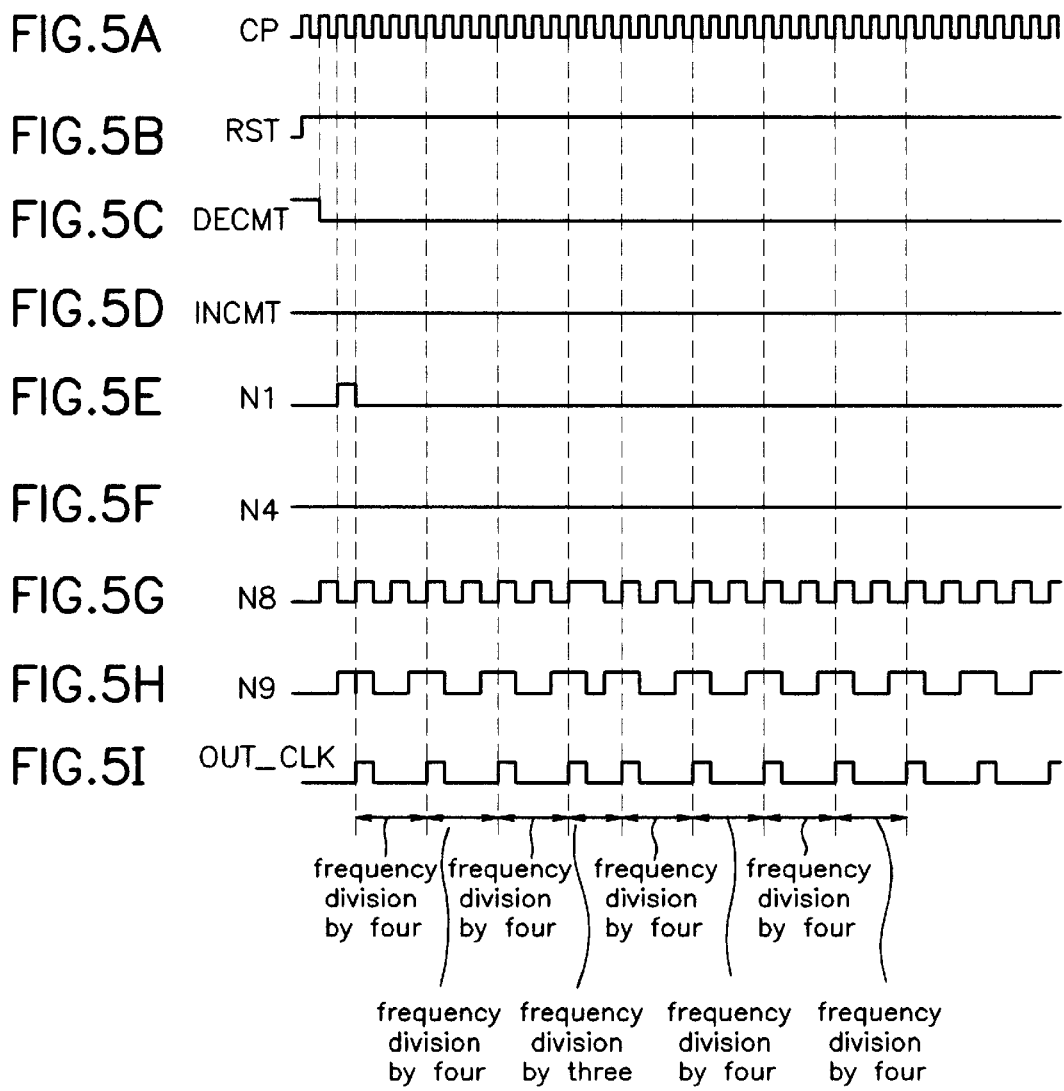
FIGS. 5A to 5I are waveforms illustrating the operation in a frequency decreasing state of FIG. 1.
Figure 6:
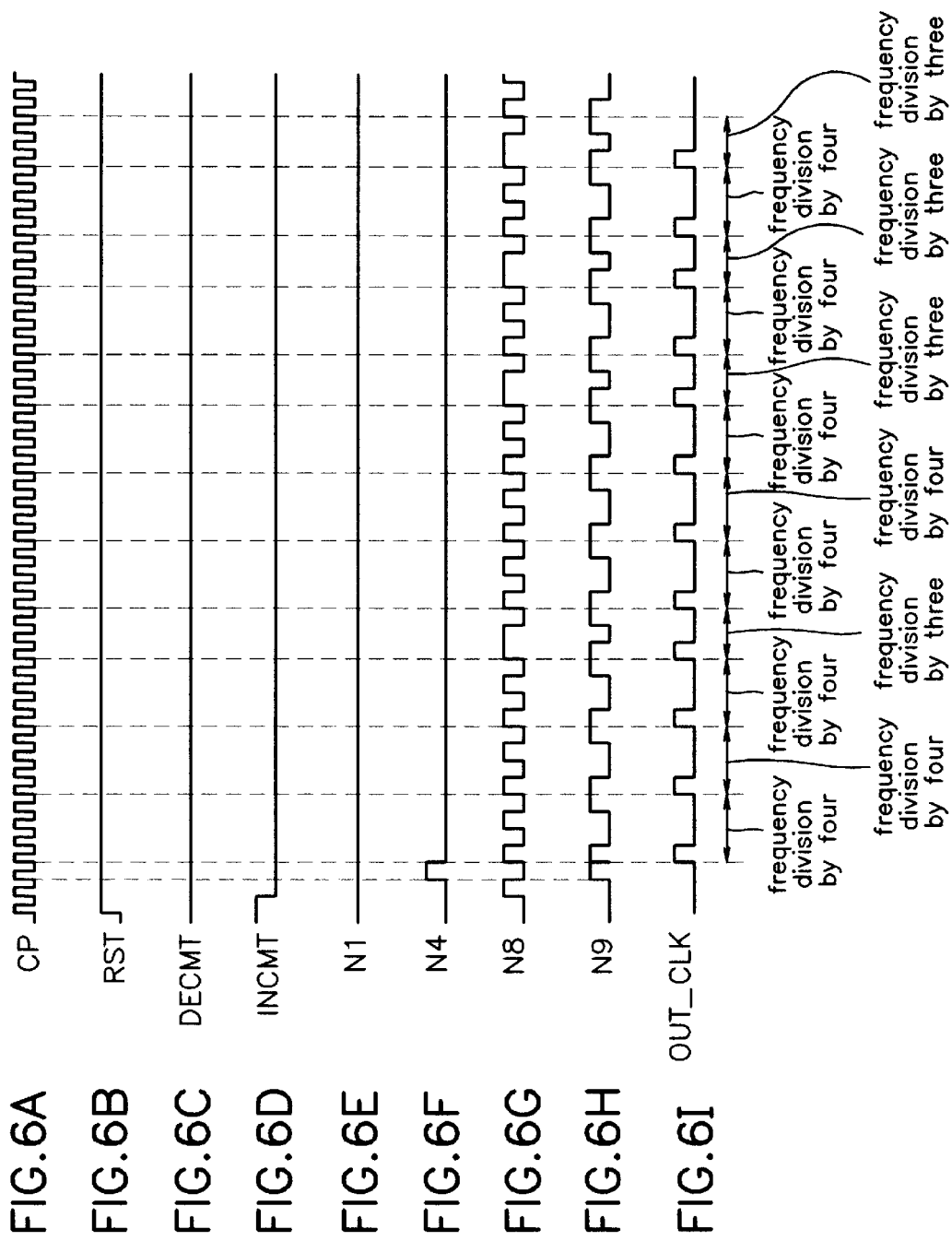
FIGS. 6A to 6I are waveforms illustrating the operation in a frequency increasing state of FIG. 1.

A sequence storing part 110 is, as shown in FIG. 1, includes first to fourth D flip-flops 111–114 to which 4-bit input of the sequence storing part 110 is respectively applied. A second inverter 115 inverts the signal CLK of the sequence storing part 110. The inverted clock signal from the inverter 115 is input to clock pulse terminals cp of the first to fourth D flip-flops 111–114. The reset terminals RST of the first to fourth D flip-flops 111–114 receive a reset signal RESET of the sequence storing part 110. Positive output signals q of the first to fourth D flip-flops 111–114 are applied to a positive output terminal Q of the sequence storing part 110, and negative output signals qn are applied to a negative output terminal QN of the sequence storing part 110.

A sequence generator 116 for executing a 4-4-4-3 frequency dividing sequence operation generates in series, i.e., sequentially, the input signals, which are received in parallel, i.e., simultaneously, from the sequence storing part 110. As shown in FIG. 12, the sequence generator 116 includes fifth to eighth D flip-flops 117–120 each of which receives signal P_I at input terminal da and signal LOAD at input terminal sa. Positive output signals q of the fifth to seventh D flip-flops 117–119 are respectively inputted to the input terminal db of the sixth to eighth D flip-flops 118–120. Clock pulse terminal cp of each of the fifth to eighth D flip-flops 117–120 receives the clock signal CLK. Reset terminal RST of each of the D flip-flops 117–120 receives the reset signal RESET. Positive output signal q of the eighth D flip-flop 120 is fed back to the input terminal db of the fifth D flip-flop 117.

A sequence control signal converter 121 for generating the 4-4-4-3 frequency dividing sequence is shown in FIG. 13. The sequence control signal converter 121 includes a second NOR gate 122, first to third AND gates 123–125, and an OR gate 126. The second NOR gate 122 receives as inputs signals UP_REQ and DN_REQ. The first AND gate 123 receives as inputs an output signal of the second NOR gate 122 and an input signal REF of the sequence control signal converter 121. The second AND gate 124 receives as inputs the signals UP_REQ and PRE_UP. The third AND gate 125 receives as inputs the signals DN_REQ and PRE_DN. The OR gate 126 receives as inputs output signals of the first to third AND gates 123–125 and generates an output signal to an output terminal CTL of the sequence control signal converter 121.

FIGS. 14A to 14M show operation waveforms of the variable frequency dividing circuit according to the present invention in which frequency division by three or four is embodied.

For example, the above operation is accomplished under the following conditions. First, the sequence storing part 110 and the sequence generator 116 operate, for example, with 4-bit data. The signal PRE_UP of the sequence control signal converter 121 has a binary value of "0", and the signal PRE_DN has a binary value of "1". Second, if the output value of the sequence control signal converter 121 is "1", the frequency divider 127 executes the frequency division by four. If the output value thereof is "0", it executes the frequency division by three.

Under the above conditions, to embody the 4-4-4-3 frequency division sequence in the variable frequency dividing circuit, data "0111" is first stored in the sequence storing part 110. In the data storing sequence, data "1", "1", "1", and "0" are orderly stored in the fourth to first D flip-flops 114 to 111. Then, the reset signal RESET and the clock signal CLK are simultaneously applied to the fourth to first D flip-flops 114 to 111. Further, data "1", "1", "1", and "0" are simultaneously generated from the positive output terminal Q of the sequence storing part 110.

Next, the signals "1", "1", "1", "0"outputted in parallel from the sequence storing point 110 are inputted to the eighth to fifth D flip-flops 120 to 117, through the signal P_I of the sequence generator 116, and resets the flip-flops 117–120. Then, the signals "1", "1", "1", and "0" of the eighth to fifth D flip-flops 120 to 117 are sequentially outputted to the sequence control signal converter 121 through the output terminal S_O.

In case of a normal state, as shown in FIGS. 10, 13, 14G, 14H, 14I and 14M, the signals "1", "1", "1", and "0"inputted to the sequence control signal converter 121 are directly transmitted to the frequency divider 127. Since the signals UP_REQ and DN_REQ have the value "0" in the normal state where the signals PRE_UP and PRE_DN are respectively set to "0" and "1". Therefore, the signals "1", "1", "1", and "0"are outputted to the frequency divider 127, which then executes the 4-4-4-3 frequency dividing sequence under the above conditions. Then, the output clock signal is continually supplied to the clock terminal CLK of the sequence generator 116.

In case a frequency increase is desired, as shown in FIGS. 10, 13, 14G, 14H, 14I and 14M, the signal DN_REQ has the value "0", and the signal UP_REQ has the value "1". As a result, the signal PRE_UP with the value "0" from the sequence control signal converter 121 is outputted through the terminal CTL, and the frequency divider 127 executes the frequency division by three under the above conditions. Then, if the frequency returns to a normal state, the value of the signal UP_REQ becomes "0".

On the other hand, in case a frequency decrease is desired, as shown in FIGS. 10, 13, 14G, 14H, 14I and 14M, the signal UP_REQ has the value "0" and the signal DN_REQ has the value "1". As a result, the signal PRE_DN with the value "1" from each of the sequence control signal converters 102 and 121 is outputted through the terminal CTL, and the frequency divider 127 executes the frequency division by four under the above conditions. Then, if the frequency returns to a normal state, the value of the signal DN_REQ becomes "0".

A frequency dividing ratio embodied by the above operation is calculated by the following expression:

$$(L \times a + M \times b)/N, \qquad \text{(Equation 1)}$$

where N=L+M.

The reference symbol "L" represents the number of data "0" stored in the sequence storing parts 100 and 110. "M" represents the number of data "1" stored in the sequence storing parts 100 and 110. Reference "a" represents the number of frequency divisions when the sequence value inputted to the frequency dividers 105 and 127 is "0". Reference "b" stands for the number of frequency divisions when the sequence value thereof is data "1". "N" stands for the number of bits stored in the sequence storing parts 100 and 110.

The range of the frequency dividing ratio embodied by the sequence combination using the variable frequency dividing circuit according to the present invention is a non-integer value between "a" and "b". For example, when executing the 4-4-4-3 frequency dividing sequence, frequency dividing ratio is obtained as follows based on the above Equation 1:

$$(1 \times 3 + 3 \times 4)/4 = 15/4 = 3.75.$$

In case of 4 bits, the frequency dividing ratios of 3, 3.25, 3.75 and 4 can be obtained in accordance with the value of the sequence storing parts 100 and 110. According to the sequence value of the sequence storing parts 100 and 110, a desired frequency dividing ratio can be obtained.

As mentioned above, a variable non-integer times frequency dividing circuit according to the present invention has the following advantages. First, since a predetermined data is applied to a sequence storing part, a desired frequency dividing ratio can be programmed. Second, a response time to a frequency variation request can be reduced with a sequence control signal converter. Third, when the circuit is used in a facsimile, modem or midi, a transmission standard clock can be generated by using an arbitrary clock.

It will be apparent to those skilled in the art that various modifications and variations can be made in a variable frequency dividing circuit of the present invention without departing from the spirit or scope of the invention. Thus, it is intended that the present invention cover the modifications and variations of this invention provided they come within the scope of the appended claims and their equivalents.

What is claimed is:

1. A variable frequency dividing circuit comprising:
    a sequence storing part for storing a predefined N-bit sequence data to output said N bits of said sequence data in parallel;
    a sequence generator for receiving said N-bit sequence data from said sequence storing part to generate a sequence control signal;
    a sequence control signal converter for receiving said sequence control signal according to a frequency variation request to generate a converted sequence control signal;
    a frequency divider for dividing a clock signal frequency according to said converted sequence control signal outputted from said sequence control signal converter; and
    a clock signal generator for producing a clock waveform in accordance with said divided clock signal frequency.

2. The variable frequency dividing circuit according to claim 1, wherein said sequence storing part is connected in parallel to a data bus to output said stored sequence data in parallel and comprises N D flip-flops, which are operated by a same clock signal.

3. The variable frequency dividing circuit according to claim 1, wherein said sequence generator comprises N D flip-flops which are connected in series with each other for sequentially outputting said N bits of said sequence data received in parallel from said sequence storing part.

4. The variable frequency dividing circuit according to claim 1, wherein said sequence control signal converter comprises:
    a NOR gate which logically NORs a frequency increasing signal and a frequency decreasing signal, and outputs the NORed result, and
    a three-input multiplexor which receives an output signal of said NOR gate, said frequency increasing signal and said frequency decreasing signal as selection signals and selects and outputs one of said sequence control signal received from said sequence generator, a binary signal "0", and a binary signal "1".

5. The variable frequency dividing circuit according to claim 4, wherein said three-input multiplexor comprises:
    a first AND gate which logically ANDs said sequence control signal and the output of said NOR gate;
    a second AND gate which logically ANDs said frequency increasing signal, and one of said binary signals "0"and "1";
    a third AND gate which logically ANDs said frequency decreasing signal, and one of said binary signals "0" and "1"; and an OR gate which logically ORs output signals of said first, second, and third AND gates.

6. The variable frequency dividing circuit according to claim 1, wherein said frequency divider comprises:
an inverter for inverting said converted sequence control signal;
a first mode counter which receives the inverted signal from said inverter and generates an output signal to a first input terminal of an output selector; and
a second mode counter which receives said converted sequence control signal and generates an output signal to a second input terminal of said output selector, wherein
said output selector generates an output indicative of the frequency division to said clock signal generator based on the output signals of said first and second mode counters.

7. The variable frequency dividing circuit according to claim 1, wherein said frequency divider comprises:
a first multiplexor which operates according to said converted sequence control signal and receives as inputs output signals of a NAND gate and an exclusive OR gate; and
a second multiplexor which operates according to said converted sequence control signal and receives as inputs a positive output signal of a first D flip-flop and a negative output signal of a second flip-flop, wherein
said first and second D flip-flops receive output signals of said first and second multiplexors, respectively, as inputs;
said NAND gate receives as inputs the positive output signals of said first and second D flip-flops to generate an output signal to a first input terminal of said first multiplexor; and
said exclusive OR gate receives as inputs the positive output signals of said first and second D flip-flops to generate an output signal to a second input terminal of said first multiplexor.

8. The variable frequency dividing circuit according to claim 1, wherein said clock signal frequency is divided by a non-integer.

9. A variable frequency dividing circuit comprising:
a sequence generator for generating a sequence control signal;
a sequence control signal converter for receiving said sequence control signal according to a frequency variation request to generate a converted sequence control signal; and
a frequency divider for dividing a clock signal frequency according to said converted sequence control signal outputted from said sequence control signal converter.

10. The variable frequency dividing circuit according to clam 9, further comprising a sequence storing part for storing a sequence data, wherein
said sequence generator receives said sequence data and generates said sequence control signal according to said sequence data.

11. The variable frequency dividing circuit according to claim 10, wherein said sequence storing part is a read only memory (ROM) for storing a predefined N-bit sequence data to output said stored sequence data in parallel.

12. The variable frequency dividing circuit according to claim 10, wherein said sequence storing part comprises D flip-flops which output said stored sequence in parallel.

13. The variable frequency dividing circuit according to claim 9, further comprising a clock signal generator for producing a frequency-divided clock signal in accordance with said divided clock signal frequency.

14. The variable frequency dividing circuit according to claim 13, wherein said clock signal generator comprises an AND gate receiving as inputs outputs of said frequency divider.

15. The variable frequency dividing circuit according to claim 9, wherein said sequence generator comprises D flip-flops which are connected in series with each other for sequentially outputting a series of sequence control signals.

16. The variable frequency dividing circuit according to claim 9, wherein said sequence control signal converter comprises:
a NOR gate which logically NORs a frequency increasing signal and a frequency decreasing signal, and outputs the NORed result, and
a three-input multiplexor which receives an output signal of the NOR gate, the frequency increasing signal and the frequency decreasing signal as selection signals and selects and outputs one of the sequence control signal received from said sequence generator, a first predetermined signal, and a second predetermined signal as the converted sequence control signal.

17. The variable frequency dividing circuit according to claim 16, wherein
said first predetermined signal is a binary "0", and said second predetermined signal is a binary "1", and
one of said first and second predetermined signals represents a frequency increase, and the other of the first and second predetermined signals represents a frequency decrease.

18. The variable frequency dividing circuit according to claim 16, wherein said three-input multiplexor comprises:
a first AND gate which logically ANDs said sequence control signal and the output of said NOR gate;
a second AND gate which logically ANDs the frequency increasing signal and said first predetermined signal;
a third AND gate which logically ANDs the frequency decreasing signal and said second predetermined signal; and
an OR gate which logically ORs the output signals of said first, second, and third AND gates.

19. The variable frequency dividing circuit according to claim 9, wherein said frequency divider comprises:
an inverter for inverting the converted sequence control signal;
a first mode counter which receives the inverted signal from the inverter and generates an output signal to a first input terminal of an output selector; and
a second mode counter which receives the converted sequence control signal and generates an output signal to a second input terminal of said output selector, wherein
the output selector generates an output indicative of the frequency division based on the output signals of said first and second mode counters.

20. The variable frequency dividing circuit according to claim 9, wherein said frequency divider comprises:
a first multiplexor which operates according to said converted sequence control signal and receives as inputs output signals of a NAND gate and an exclusive OR gate; and
a second multiplexor which operates according to said converted sequence control signal and receives as inputs a positive output signal of a first D flip-flop and a negative output signal of a second D flip-flop, wherein said first and second D flip-flops receive output signals of said first and second multiplexors, respectively, as inputs;

said NAND gate receives as inputs the positive output signals of said first and second D flip-flops to generate an output signal to a first input terminal of said first multiplexor; and said exclusive OR gate receives as inputs the positive output signals of said first and second D flip-flops to generate an output signal to a second input terminal of said first multiplexor.

21. The variable frequency dividing circuit according to claim 9, wherein said clock signal frequency is divided by a non-integer.

22. A variable frequency dividing circuit comprising:

a sequence storing part for storing a predefined N-bit sequence data to output said N bits of said sequence data in parallel, wherein said sequence storing part comprises N D flip-flops connected in parallel to a data bus to output said stored sequence data in parallel;

a sequence generator for receiving said N-bit sequence data from said sequence storing part to generate a series of sequence control signals, wherein said sequence generator comprises D flip-flops which are connected in series with each other for sequentially outputting a series of sequence control signals;

a sequence control signal converter for receiving said sequence control signal according to a frequency variation request to generate a converted sequence control signal, wherein said sequence control signal converter comprises a NOR gate which logically NORs a frequency increasing signal and a frequency decreasing signal, and outputs the NORed result, and a three-input multiplexor which receives an output signal of said NOR gate, said frequency increasing signal and said frequency decreasing signal as selection signals and selects and outputs one of said sequence control signal received from said sequence generator, a binary signal "0", and a binary signal "1";

a frequency divider for dividing a clock signal frequency according to said converted sequence control signal outputted from said sequence control signal converter, wherein said frequency divider comprises an inverter for inverting said converted sequence control signal, a first mode counter which receives the inverted signal from said inverter and generates an output signal to a first input terminal of an output selector, and a second mode counter which receives said converted sequence control signal and generates an output signal to a second input terminal of said output selector, wherein said output selector receives generates an output indicative of the frequency division to said clock signal generator based on the output signals of said first and second mode counters; and a clock signal generator for producing a clock waveform in accordance with said divided clock signal frequency.

* * * * *